(12) United States Patent
Andry et al.

(10) Patent No.: US 9,312,761 B2
(45) Date of Patent: Apr. 12, 2016

(54) THREE-D POWER CONVERTER IN THREE DISTINCT STRATA

(71) Applicant: International Business Machines Corporation, Armonk, NY (US)

(72) Inventors: Paul S. Andry, Yorktown Heights, NY (US); Leland Chang, New York, NY (US); Evan G. Colgan, Chestnut Ridge, NY (US); John U. Knickerbocker, Yorktown Heights, NY (US); Bucknell C. Webb, Yorktown Heights N, NY (US); Robert Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 14/178,791

(22) Filed: Feb. 12, 2014

(65) Prior Publication Data

US 2015/0229295 A1    Aug. 13, 2015

(51) Int. Cl.
| | | |
|---|---|---|
| *H03K 3/00* | (2006.01) |
| *H02M 3/156* | (2006.01) |
| *H02M 1/08* | (2006.01) |
| *G06F 1/26* | (2006.01) |
| *H05K 1/00* | (2006.01) |

(52) U.S. Cl.
CPC ............ *H02M 3/156* (2013.01); *G06F 1/263* (2013.01); *H02M 1/08* (2013.01); *H05K 1/00* (2013.01); *H01L 2224/16225* (2013.01); *Y10T 29/49117* (2015.01)

(58) Field of Classification Search
None
See application file for complete search history.

(56) References Cited

U.S. PATENT DOCUMENTS

| | | | |
|---|---|---|---|
| 6,429,632 B1 | 8/2002 | Forbes et al. | |
| 6,879,111 B2 * | 4/2005 | Voto et al. | 315/169.3 |
| 7,176,506 B2 * | 2/2007 | Beroz et al. | 257/232 |
| 7,268,410 B1 | 9/2007 | Hopper et al. | |
| 7,291,869 B2 | 11/2007 | Otremba | |
| 7,312,487 B2 * | 12/2007 | Alam et al. | 257/278 |
| 7,838,964 B2 * | 11/2010 | Carobolante et al. | 257/531 |
| 7,932,800 B2 * | 4/2011 | Lim et al. | 336/200 |
| 8,102,029 B2 | 1/2012 | Liu et al. | |
| 2007/0131938 A1 | 6/2007 | Williams | |
| 2013/0285739 A1 * | 10/2013 | Blaquiere et al. | 327/565 |

* cited by examiner

*Primary Examiner* — Lincoln Donovan
*Assistant Examiner* — Khareem E Almo
(74) *Attorney, Agent, or Firm* — Scully, Scott, Murphy & Presser, P.C.; Louis J. Percello, Esq.

(57) ABSTRACT

A switching power supply in an integrated circuit, an integrated circuit comprising a switching power supply, and a method of assembling a switching power supply in an integrated circuit are disclosed. In one embodiment, the invention provides a three-dimensional switching power supply in an integrated circuit comprising a device layer. The switching power supply comprises three distinct strata arranged in series with the device layer, the three distinct strata including a switching layer including switching circuits, a capacitor layer including banks of capacitors, and an inductor layer including inductors. This switching power supply further comprises a multitude of connectors electrically and mechanically connecting together the device layer, the switching layer, the capacitor layer, and the inductor layer. The switching circuits, the capacitors and the inductors form a switching power supply for supplying power to the device layer.

25 Claims, 5 Drawing Sheets

3D CHIPSTACK
LOCAL ON-CHIP GENERATION OF VOLTAGES WITH
INTEGRATED VOLTAGE REGULATORS (iVRM)

POWER GATING + GLOBAL VOLTAGE    FINE-GRAIN VOLTAGE CONTROL

THREE-D POWER CONVERTER IN THREE DISTINCT STRATA

BACKGROUND

This invention generally relates to power converters, and more specifically, to switching power supplies in integrated circuits.

Typical server processors require six to eight distinct voltage levels (e.g. core, I/O, memory, etc.) at the chip level. This drives complexity in the first level package, and consumes space for multiple DC-DC converters as well as additional power plane wiring levels in the system board. Further, while most of the voltage levels are between 1 and 2 Volts (with the exception of I/O drivers), the current levels are high enough to cause significant resistive losses as well as electromigration lifetime issues in (medium to high power) chip solder C4s which are used to join the chip to the first level package. In particular, such challenges limit the number of independent, high-current voltages that can be delivered to a chip, which becomes problematic as it restricts the ability to perform fine-grain voltage control within a chip (e.g. independent voltage islands to create separate voltages per processor core) to improve power efficiency.

BRIEF SUMMARY

Embodiments of the invention provide a switching power supply in an integrated circuit, an integrated circuit comprising a switching power supply, and a method of assembling a switching power supply in an integrated circuit.

In one embodiment, the invention provides a three-dimensional switching power supply in an integrated circuit. The integrated circuit includes a device layer; and the switching power supply comprises three distinct strata arranged in series with the device layer. The three distinct strata of the switching power supply include a switching layer including switching circuits, a capacitor layer including banks of capacitors, and an inductor layer including inductors. This switching power supply further comprises a multitude of connectors electrically and mechanically connecting together the device layer, the switching layer, the capacitor layer, and the inductor layer. The switching circuits, the capacitors and the inductors form a switching power supply for supplying power to the device layer.

The device layer may include a range of types of electronic devices. In embodiments of the invention, the device layer includes one or more microprocessor or processing cores. In embodiments of the invention, the device layer includes logic devices, or individual logic gates or transistors. In embodiments of the invention, individual devices may have their own on-chip switching power supply.

In an embodiment, the three strata of the switching power supply are located in series between the device layer and a first level package.

In one embodiment, the switching layer includes active circuitry to monitor continuously defined parameters of the switching power supply.

In one embodiment, the multitude of connectors includes a first set of C4 connectors connecting the switching power supply to the device layer to conduct power from the switching power supply to the device layer.

In an embodiment, the first set of C4 connectors are arranged at a defined pitch between the switching power supply and the device layer.

In one embodiment, the device layer includes a plurality of processor cores, and the switching power supply includes a fine-grained voltage control to control the switching power supply to apply a controllable voltage to each of the processor cores.

In an embodiment, the fine-grained voltage control controls the switching power supply to apply simultaneously a plurality of separately controllable voltages to different areas of each of the processor cores.

In one embodiment, one of said strata of the switching power supply functions as a base layer of a first level package.

In an embodiment, the three distinct strata includes a first strata, a second strata and a third strata. The first strata is located adjacent the device layer, the second strata is located between the first strata and the third strata, and the third strata functions as the base layer of the first level package.

In an embodiment, the inductor layer of the switching power supply functions as the base layer of the first level package.

In one embodiment, the strata that functions as the base layer of the first level package is comprised of a glass wafer.

In an embodiment, the capacitor layer is fabricated using DRAM trench cells and Cu BEOL wiring.

In one embodiment, the invention provides an integrated circuit comprising a device layer and a switching power supply comprising three distinct strata arranged in series with the microprocessor layer. The three distinct strata include a switching layer including switching circuits, a capacitor layer including banks of capacitors, and an inductor layer including inductors. The integrated circuit further comprises a multitude of connectors electrically and mechanically connecting together the device layer, the switching layer, the capacitor layer, and the inductor layer; and the switching circuits, the capacitors and the inductors form a switching power supply for supplying power to the device layer.

In an embodiment, the three strata of the switching power supply are located in series between the device layer and a first level package.

In one embodiment, the multitude of connectors includes a first set of C4 connectors connecting the switching power supply to the device layer to conduct power from the switching power supply to the device layer; and the first set of C4 connectors are arranged at a defined pitch between the switching power supply and the device layer.

In an embodiment, one of said strata functions as a base layer of a first level package.

In an embodiment, of the strata that functions as the base layer of the first level package is the inductor layer and is comprised of a glass wafer.

In an embodiment, the invention provides a method of assembling a switching power supply in an integrated circuit. The integrated circuit includes a device layer; and the switching power supply includes three distinct strata including a switching layer including switching circuits, a capacitor layer including banks of capacitors, and an inductor layer including inductors. The method comprises arranging the three distinct strata of the switching power supply in series with the device layer; and electrically and mechanically connecting together the device layer, the switching layer, the capacitor layer, and the inductor layer to form a switching power supply for supplying power to the device layer.

In one embodiment, the arranging includes locating the three strata of the switching power supply in series between the device layer and a first level package.

In an embodiment, the electrically and mechanically connecting together the device layer, the switching layer, the capacitor layer, and the inductor layer includes using a first set of C4 connectors to connect the switching power supply to the device layer to conduct power from the switching power supply to the device layer; and arranging the first set of C4 connectors at a defined pitch between the switching power supply and the device layer.

In one embodiment, the arranging the three distinct strata of the switching power supply in series with the device layer includes using one of said strata as a base layer of a first level package.

In an embodiment, the three distinct strata of the switching power supply include a first strata, a second strata and a third strata. The first strata is located adjacent the microprocessor layer and the second strata is located between the first strata and the third strata. The third strata functions as the base layer of the first level package and is the inductor layer.

Embodiments of the invention provide a power converter built in three strata. Each stratum includes through-silicon vias (TSVs) for 3D interconnect as well as one or more of the essential passive or active components needed to build an efficient, switching power supply. In particular, an embodiment of the invention comprises 1) a 3D CMOS layer comprising active CMOS switching circuits, control logic and power supply health circuitry, 2) a 3D capacitor layer populated with large, high-density banks of capacitance, and 3) an inductor layer containing the high-inductance passives required to make an efficient buck power supply at a reasonable switching frequency (e.g. 100 MHz or less).

DETAILED DESCRIPTION

Figure 1:
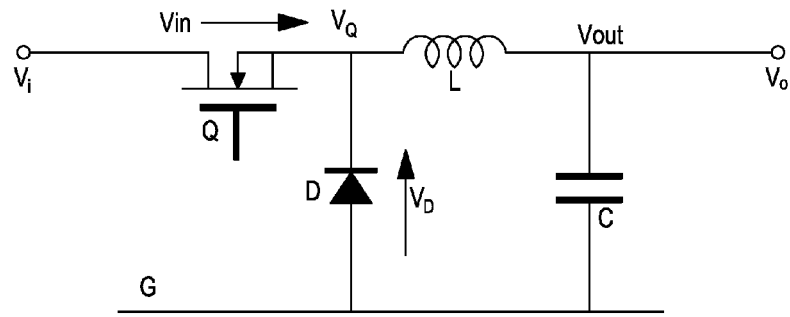
FIG. 1 is a schematic diagram illustrating the principles of switching power supplies.

This invention relates to switching power supplies in an integrated circuit. As mentioned above, typical server processors require six to eight distinct voltage levels (e.g. core, I/O, memory, etc.) at the chip level. This drives complexity in the first level package, and consumes space for multiple DC-DC converters as well as additional power plane wiring levels in the system board. Further, while most of the voltage levels are between 1 and 2 Volts (with the exception of I/O drivers), the current levels are high enough to cause significant resistive losses as well as electromigration lifetime issues in (medium to high power) chip solder C4s which are used to join the chip to the first level package. In particular, such challenges limit the number of independent, high-current voltages that can be delivered to a chip, which becomes problematic as it restricts the ability to perform fine-grain voltage control within a chip (e.g. independent voltage islands to create separate voltages per processor core) to improve power efficiency.

If these C4s could supply a single moderate voltage (e.g. 5 Volts) at a proportionately lower current level, their lifetime could be extended while package and board complexity could be significantly reduced. Further, additional C4s could be available for communication signals to and from the chip. This would require power conversion between the chip and the package, above the standard pitch C4s, and below a finer pitch interconnect layer designed to carry more power to the chip.

Embodiments of the invention enable/improve "per-core" voltage control. This, in turn, may be used to achieve a number of significant advantages. For instance, this improved per-core voltage control may be used to obtain a high-V delivery, which results in a low current. The improved per-core voltage control also may be used to achieve voltage consolidation, which enables or improves locally generating Vcs, Vio, etc. In addition, the improved per-core voltage control enables or improves dynamic voltage scaling, which helps to achieve a fine grain performance throttling. Such fine-grain control is not practical with off-chip (i.e., discrete or package-integrated inductors) due both to form-factor and C4 needs.

The industry drive towards smaller, lighter and more efficient electronics has led to the development of switching-mode power conversion technology. Switching power supplies (SMPS) incorporate power handling electronic components which are continuously commutating on and off with high frequency. These electronic switches effectively connect and disconnect energy storage inductor(s) and capacitor(s) to and from the input source or the output. By varying duty cycle, frequency or phase shift of these commutations, an output parameter (such as output voltage) is controlled. Output filters are "averaging" energy transfer rate and assure continuous power flow into the load. The DC gain of a converter is calculated based on the fact that in steady state, the net volt-seconds across an inductor over one switching cycle must be zero.

Embodiments of this invention may be used with any suitable type of switched mode power supply such as boost converters, buck converters, or buck-boost converters. As an example, FIG. 1 illustrates the concept of switching power supply. The switching power supply shown in FIG. 1 is of the type referred to as a buck converter, in which energy is transferred from the input to the load during a conduction cycle of a switching transistor.

The sample converter shown in FIG. 1 comprises an input port Vi to receive an input voltage Vin referenced to a common ground G, and an output port Vo to provide an output voltage Vout referenced to the common ground G. The circuit shown in FIG. 1 further comprises an output inductor L, a switch Q coupled between the input voltage and inductor L, a diode D coupled between ground and inductor L, and an output capacitor C coupled in parallel with the output port Vo.

When switch Q is switched on, it couples voltage and power to inductor L, which stores some of the energy and passes some of the energy to the output port Vo. When switch Q is in its off state, the inductor L discharges some or all of its stored energy to the output port Vo.

A controller (not shown) is provided to control the on and off states of switch Q. The controller may comprise various analog and digital circuits known in the art. Generally, the controller receives operating power from the input port Vi, monitors the output voltage Vout, and continually adjusts the relative duration of the on and off states of switch Q to keep the output voltage Vout close to the target value.

Switch Q may comprise any suitable transistor, and diode D may comprise any suitable type of rectifier device, such as a p-n diode or a Schottky barrier rectifier. For low voltage (e.g., less than 3.5 V) applications at low power (e.g., less than 5 watts), switch Q may comprise a PMOS transistor, and diode D may comprise an NMOS transistor, which provides low voltage drops across the terminals. This, in turn, provides higher power conversion efficiency since less power is wasted by voltage drops. The NMOS and PMOS transistors may be implemented in a conventional CMOS technology along with the switch controller.

Other converter topologies differ from the buck topology in the relative placement of the inductor and switches around the switched node. For example, in the boost topology, the inductor is coupled between the input node and the switched node, the primary switch is coupled between the switch node and the common ground, and the secondary switch is coupled between the switched node and the output port (and is usually implemented as a rectifier).

In accordance with an embodiment of this invention, an integrated circuit is provided with a switching power supply comprised of three separate strata. Each stratum includes through-silicon vias (TSVs) for 3D interconnect as well as one or more of the essential passive or active components needed to build an efficient, switching power supply. In particular, an embodiment of the invention comprises 1) a 3D CMOS layer comprising active CMOS switching circuits, control logic and power supply health circuitry, 2) a 3D capacitor layer populated with large, high-density banks of capacitance, and 3) an inductor layer containing the high-inductance passives required to make an efficient bucking power supply at a reasonable switching frequency (e.g. 100 MHz or less).

Figure 2:
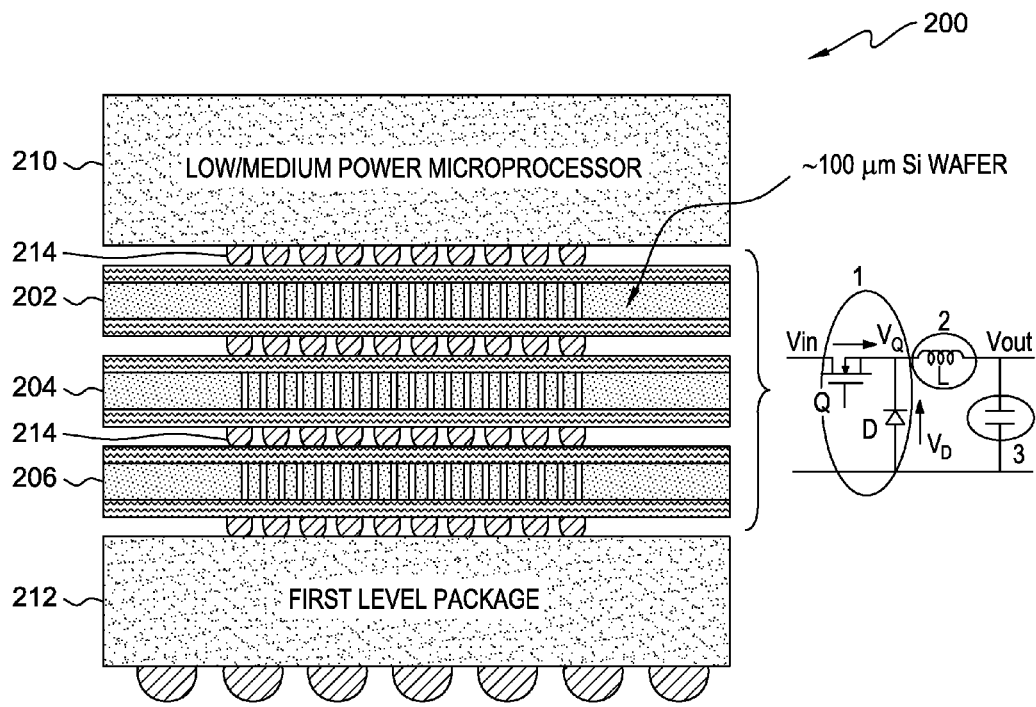
FIG. 2 shows an embodiment of the invention used with a low/medium power device.
Figure 3:
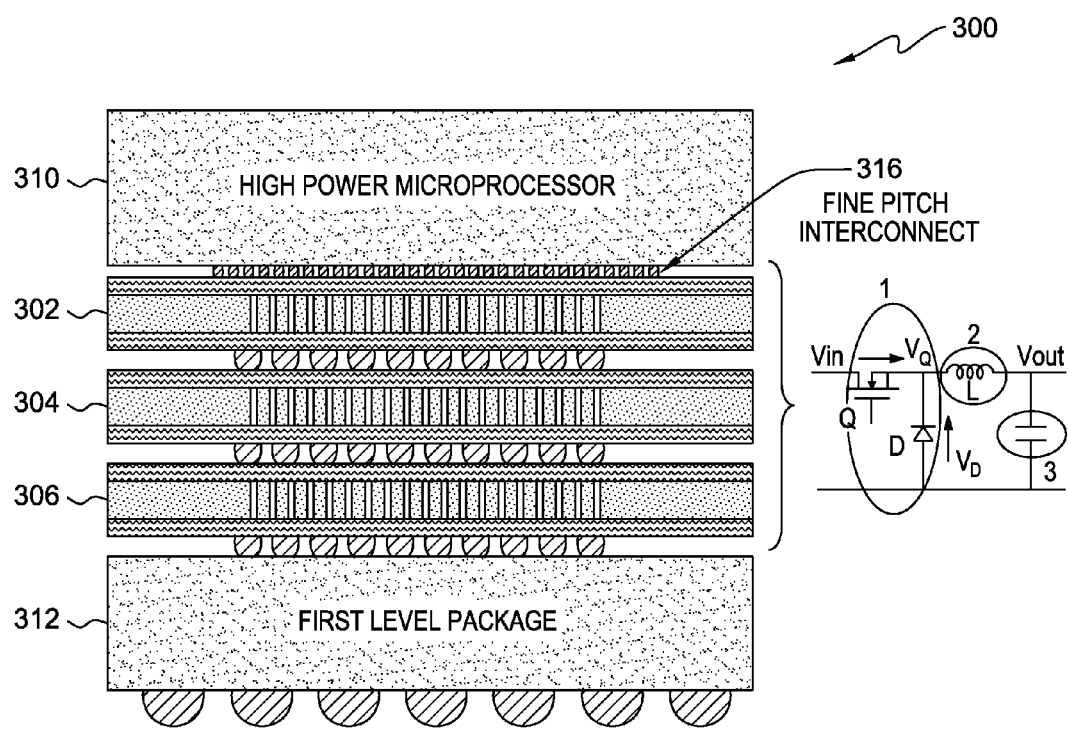
FIG. 3 illustrates an embodiment of the invention used with a high power device.
Figure 4:
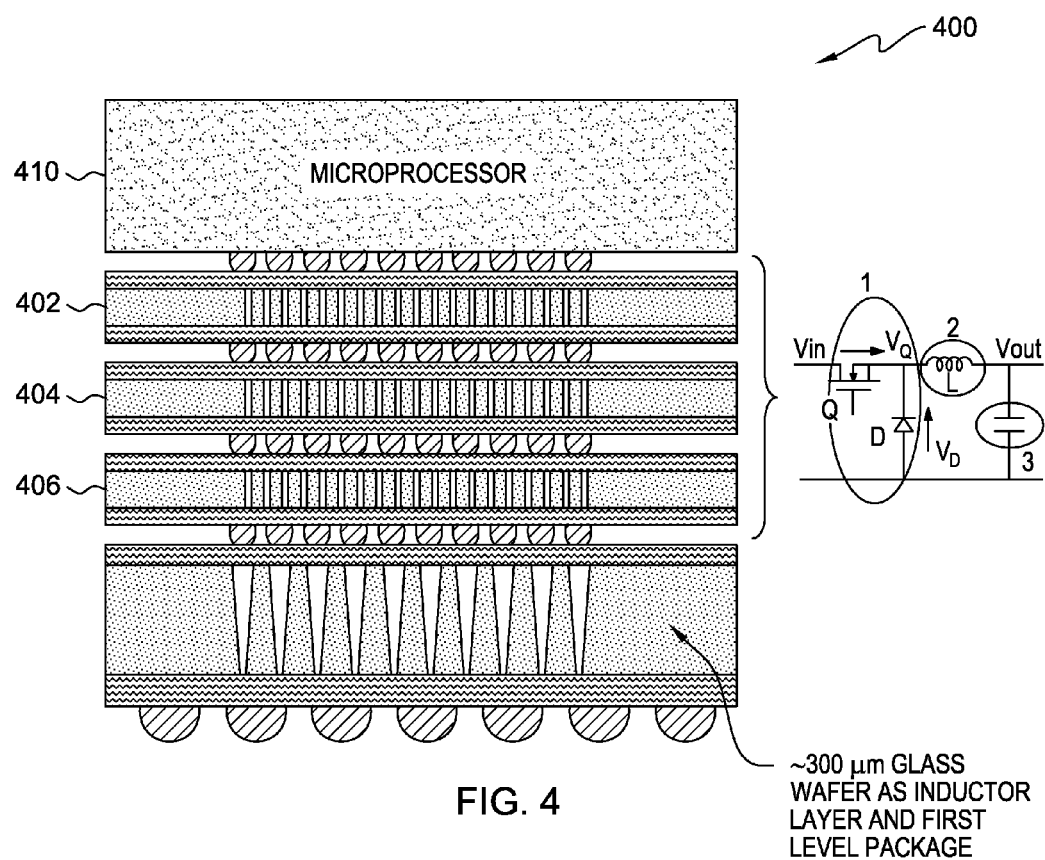
FIG. 4 shows an embodiment of the invention in which a glass substrate is used as both an inductor layer and a first level package.

FIGS. 2, 3 and 4 show embodiments of the invention. Each of these embodiments comprises a microprocessor, and a switching power supply comprised of separate strata arranged in series with the microprocessor. In each of these embodiments, one of the strata of the power supply provides the active CMOS switching circuits, the control logic and the power supply health circuitry of the power supply. A second of the strata provides the capacitance of the power supply, and a third of the strata supplies the inductance of the power supply.

Also, in each embodiment, each strata of the power supply includes through-silicon vias (TSVs) for three-D interconnect. In addition, in each embodiment, controlled collapse chip connection (C4), also referred to as flip chip or mini solder balls, is used to connect together different strata of the power supply, and to connect different strata of the power supply to the microprocessor.

Each of the embodiments shown in FIGS. 2, 3 and 4 includes a first level package. In the embodiments of FIGS. 2 and 3, the first level package is in addition to the switching power supply and is connected thereto by C4 connections. In the embodiment of FIG. 4, the inductor layer of the switching power supply is also the first level package. The circuit diagrams on the right side of FIGS. 2, 3 and 4 indicate the content of the three strata which comprise the switching power supply.

More specifically, FIG. 2 illustrates power supply 200 comprising strata 202, 204 and 206 arranged in series between a low/medium power microprocessor 210 and a first level package 212. In this embodiment, standard pitch (about 150 to 250 micron) C4s 214 are used to connect the power supply to the microprocessor, to connect the power supply to the first level package, and to connect together the three strata of the power supply.

FIG. 3 shows power supply 300 comprising strata 302, 304 and 306, arranged in series between a high power microprocessor 310 and a first level package 312. C4s are also used, in this embodiment, to connect together strata of the switching power supply and to connect the power supply to microprocessor 310 and to first level package 312. In this embodiment, though, in comparison with the C4 arrangement shown in FIG. 2, a finer pitch interconnect layer 316, with a pitch of less than 150 microns, is used to connect the power supply to the microprocessor in order to carry more power to that microprocessor.

FIG. 4 illustrates power supply 400 comprising strata 402, 404 and 406 shown in series beneath a microprocessor 410. In this embodiment, the strata 406 of the power supply functions as the inductance layer of the power supply and also functions as the first level package.

Known techniques may be used to form the individual strata of the switching power supply of this invention, and to secure that power supply in place.

The strata that holds the inductors may, for example, comprise a base semiconductor or silicon or glass or polymer substrate and thin film magnetic inductors having copper coils formed in a first surface of the substrate or formed inside the substrate. In the strata that provides the capacitance, the capacitors may be integrated into a component substrate. The strata may have any suitable thickness; and one example range is from about 0.002 to 0.050 inches thick. Any suitable procedure may be used to form the through silicon vias, and the via holes are filled with an electrical conductor such as copper, tungsten, solder, or sintered silver particles.

The switching strata of the power supplies may be implemented as thinned semiconductor dies with TSV. Techniques and methods for designing and fabricating embedded active circuits are known to persons skilled in the art.

Also, as mentioned above, in embodiments of the invention C4 technology is used to connect together various components or strata. This technology is well known. In this technology, in order to connect a first strata or chip to a second strata or chip, solder bumps are deposited on a surface of the first chip or strata. After dicing, the chip or strata is flipped over and the solder bumps are aligned with matching pads on the second chip or strata. Then the solder is reflowed to complete the interconnect.

Embodiments of the invention achieve fine-grained voltage control, specifically, with respect to the spatial locality of the voltages. In embodiments of the invention, different voltages may be applied to each of the processor cores in a multi-core processor chip.

For example, in an 8-core processor, it may be desirable to apply different voltages to each core depending on the workload being run. This may save power (e.g., in the case of disparate workloads in the various cores, where some cores may need a high voltage to run time-critical workloads, and other cores can tolerate a lower voltage to run less time-critical workloads.

It is difficult or impractical to use external voltage regulators to generate all these different voltages, since feeding in so many external voltages to the chip become unwieldy. Embodiments of the invention are able to generate a large number of voltages locally.

Figure 5:
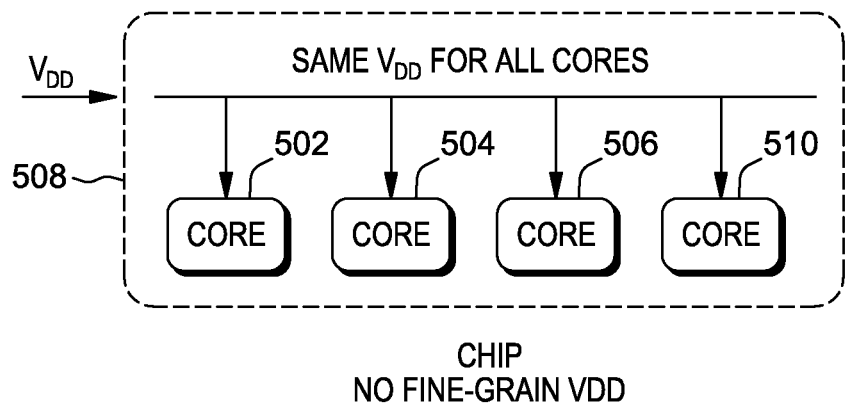
FIG. 5 depicts a multi-core processing chip in which the same voltage Vdd is applied to all the cores.
Figure 6:
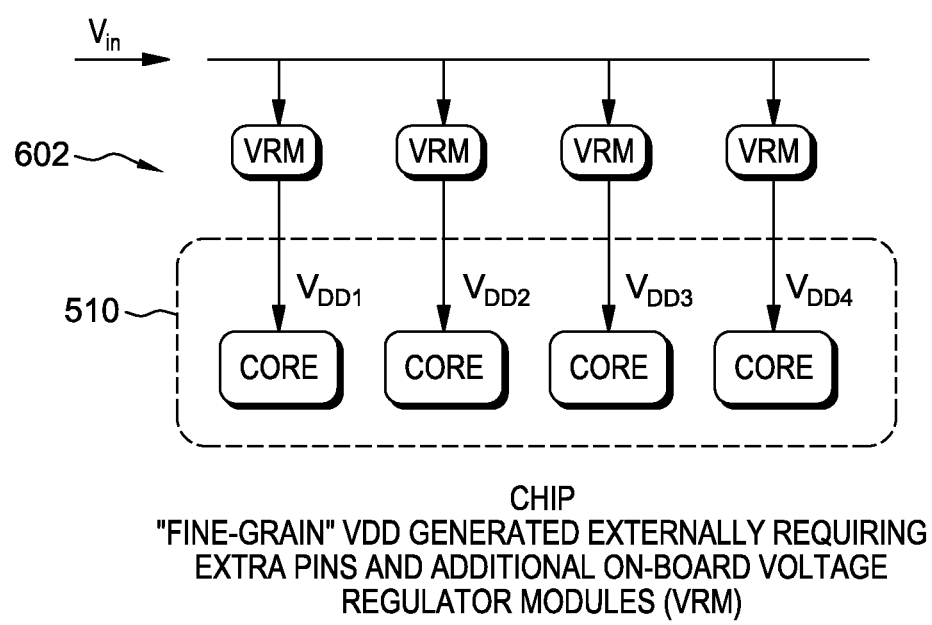
FIG. 6 shows a multi-core processing ship in which different voltages are applied to the cores via external voltage regulators.
Figure 7:
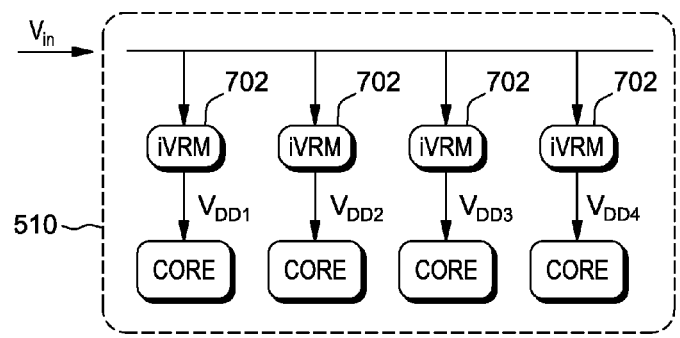
FIG. 7 illustrates a multi-core processing chip in which different voltages are applied to the cores via integrated voltage regulators.

FIG. 5 shows an arrangement in which a voltage Vdd from an external source is applied to each of four cores 502, 504, 506, 508 of a processor chip 510. As depicted in FIG. 6, different voltages, Vdd1-Vdd4, for the different cores can be generated externally, but this requires extra pins and additional on-board voltage regulator modules (VRMs) 602. In contrast, as shown in FIG. 7, embodiments of the invention provide local on-chip generation of the different voltages, Vdd1-Vdd4, for the different cores with integrated voltage regulators (iVRMs) 702.

This fine-grained voltage control can be extended, in embodiments of the invention, to smaller and smaller portions of the processor chip, for instance, to operate different portions of the processor core itself at different voltages. This may be done, for example, to try to save more power.

Figure 8:
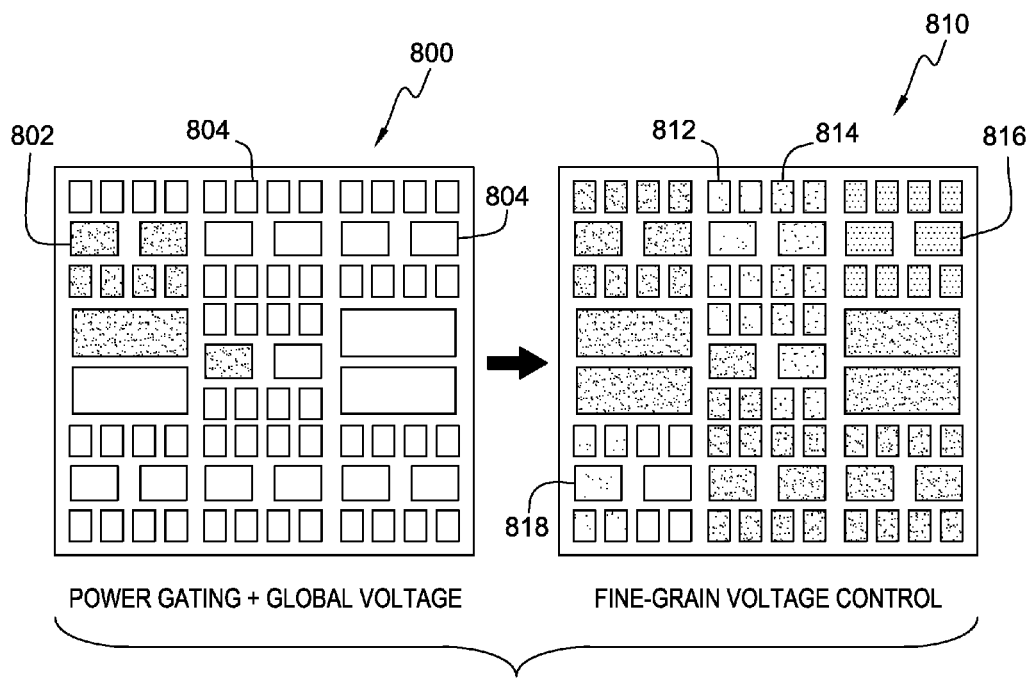
FIG. 8 shows two multi-core processing chips separated into multiple areas; and Power gating and a global voltage are applied to the multiple areas of one chip, and fine grain voltage control is applied to the multiple areas of the second chip.

FIG. 8 illustrates processor chips 800 and 810 separated into multiple areas. With chip 800, only two voltages, Vdd or ground, can be applied to different areas of the chip; and for instance, Vdd may be applied to areas 802, while areas 804 are at ground, or turned off. Chip 810 depicts an embodiment of this invention in which a large number of different voltages levels are applied to different areas of the chip. For example, different voltages may be applied to each of areas 812, 814, 816 and 818. In embodiments of the invention, individual devices, such as individual processor cores, logic devices, or gates, may each have their own switching power supply.

The power consumed by an electronic device is proportional to the square of the voltage applied to the device. Hence, applying customized, fine-grain voltages to the multiple areas of the chip may significantly reduce the power consumed by the chip.

While it is apparent that the invention herein disclosed is well calculated to achieve the features discussed above, it will be appreciated that numerous modifications and embodiments may be devised by those skilled in the art, and it is intended that the appended claims cover all such modifications and embodiments as fall within the true spirit and scope of the present invention.

The invention claimed is:

1. A three-dimensional switching power supply in an integrated circuit stack comprising a device layer, the switching power supply comprising:
    three distinct strata arranged in series with the device layer, the three distinct strata including
    a switching layer including switching circuits,
    a capacitor layer including banks of capacitors, and
    an inductor layer including inductors; and
    a multitude of connectors electrically and mechanically connecting together the device layer, the switching layer, the capacitor layer, and the inductor layer;
    wherein the switching circuits, the capacitors and the inductors form a switching power supply for supplying power to the device layer.

2. The three-dimensional switching power supply according to claim 1, wherein:
    the three strata of the switching power supply are located in series between the device layer and a first level package; and
    one or more of the strata defines a plurality of through-silicon-vias for three-dimensional interconnects in the switching power supply.

3. The three-dimensional switching power supply according to claim 1, wherein the switching layer includes active circuitry to monitor continuously defined parameters of the switching power supply.

4. The three-dimensional switching power supply according to claim 1, wherein the multitude of connectors includes a first set of C4 connectors connecting the switching power supply to the device layer to conduct power from the switching power supply to the device layer.

5. The three-dimensional switching power supply according to claim 4, wherein the first set of C4 connectors are arranged at a defined pitch less than 150 microns between the switching power supply and the device layer.

6. The three-dimensional switching power supply according to claim 1, wherein:
    the device layer includes a plurality of processor cores; and
    the switching power supply includes a fine-grained voltage control to control the switching power supply to apply a controllable voltage to each of the processor cores.

7. The three-dimensional switching power supply according to claim 6, wherein:
    the fine-grained voltage control controls the switching power supply to apply simultaneously a plurality of separately controllable voltages to different areas of each of the processor cores.

8. The three-dimensional switching power supply according to claim 1, wherein:
    the three distinct strata includes a first strata, a second strata and a third strata;
    the first strata is located adjacent the device layer;
    the second strata is located between the first strata and the third strata; and
    the third strata functions as a base layer of a first level package.

9. The three-dimensional switching power supply according to claim 7, wherein said third strata is the inductor layer and is comprised of a glass wafer.

10. The three dimensional switching power supply according to claim 1, wherein the capacitor layer is fabricated using DRAM trench cells and Cu BEOL wiring.

11. An integrated circuit comprising:
    a device layer;
    a switching power supply comprising three distinct strata arranged in series with the device layer, the three distinct strata including
    a switching layer including switching circuits,
    a capacitor layer including banks of capacitors, and
    an inductor layer including inductors; and
    a multitude of connectors electrically and mechanically connecting together the device layer, the switching layer, the capacitor layer, and the inductor layer;
    wherein the switching circuits, the capacitors and the inductors form a switching power supply for supplying power to the device layer.

12. The integrated circuit according to claim 11, wherein:
    the three strata of the switching power supply are located in series between the device layer and a first level package.

13. The integrated circuit according to claim 11, wherein:
    the multitude of connectors includes a first set of C4 connectors connecting the switching power supply to the device layer to conduct power from the switching power supply to the device layer; and
    the first set of C4 connectors are arranged at a defined pitch less than 150 microns between the switching power supply and the device layer.

14. The integrated circuit according to claim 11, wherein one of said strata functions as a base layer of a first level package.

15. The integrated circuit according to claim 14, wherein said one of the strata is the inductor layer and is comprised of a glass wafer.

16. A method of assembling a switching power supply in an integrated circuit, the switching power supply including three distinct strata including a switching layer including switching circuits, a capacitor layer including banks of capacitors, and an inductor layer including inductors, the integrated circuit including a device layer, the method comprising:

arranging the three distinct strata of the switching power supply in series with the device layer; and electrically and mechanically connecting together the device layer, the switching layer, the capacitor layer, and the inductor layer to form a switching power supply for supplying power to the device layer.

17. The method according to claim 16, wherein the arranging includes locating the three strata of the switching power supply in series between the device layer and a first level package.

18. The method according to claim 16, wherein the electrically and mechanically connecting together the device layer, the switching layer, the capacitor layer, and the inductor layer to form a switching power supply for supplying power to the device layer includes:

using a first set of C4 connectors to connect the switching power supply to the device layer to conduct power from the switching power supply to the device layer; and arranging the first set of C4 connectors at a defined pitch less than 150 microns between the switching power supply and the device layer.

19. The method according to claim 16, wherein the arranging the three distinct strata of the switching power supply in series with the device layer includes using one of said strata as a base layer of a first level package.

20. The method according to claim 19, wherein:

the three distinct strata includes a first strata, a second strata and a third strata;

the first strata is located adjacent the device layer;

the second strata is located between the first strata and the third strata; and said one of the strata is the third strata and is the inductor layer.

21. A three-dimensional switching power supply in an integrated circuit, the switching power supply comprising:

three distinct strata arranged in series with a device layer of the integrated circuit, the three distinct strata including a first strata, a second strata and a third strata, the first strata being located adjacent the device layer, and the second strata being located between the first strata and the third strata; and one of said strata being a switching layer including switching circuits, another of said strata being a capacitance layer and including banks of capacitors, and a further one of said strata being a inductance layer and including inductors; and a multitude of connectors electrically and mechanically connecting together the device layer, the switching layer, the capacitance layer, and the inductance layer; and wherein the switching circuits, the capacitors and the inductors form a switching power supply for supplying power to the device layer.

22. The three-dimensional switching power supply according to claim 21, wherein:

the three strata of the switching power supply are located in series between the device layer and a first level package.

23. The three-dimensional switching power supply according to claim 21, wherein:

the multitude of connectors includes a first set of C4 connectors connecting the switching power supply to the device layer to conduct power from the switching power supply to the device layer; and the first set of C4 connectors are arranged at a defined pitch less than 150 microns between the switching power supply and the device layer.

24. The three-dimensional switching power supply according to claim 21, wherein the inductance layer functions as a base layer of a first level package.

25. The three dimensional switching power supply according to claim 21, wherein the capacitor layer is fabricated using DRAM trench cells and Cu BEOL wiring.

* * * * *